United States Patent
Lauffer et al.

(10) Patent No.: US 7,383,629 B2
(45) Date of Patent: Jun. 10, 2008

(54) METHOD OF MAKING CIRCUITIZED SUBSTRATES UTILIZING SMOOTH-SIDED CONDUCTIVE LAYERS AS PART THEREOF

(75) Inventors: John M. Lauffer, Waverly, NY (US); Voya R. Markovich, Endwell, NY (US); Michael Wozniak, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 446 days.

(21) Appl. No.: 10/991,532

(22) Filed: Nov. 19, 2004

(65) Prior Publication Data
US 2006/0110898 A1    May 25, 2006

(51) Int. Cl.
*H05K 3/06* (2006.01)
*H05K 3/38* (2006.01)
*H05K 3/46* (2006.01)

(52) U.S. Cl. ............................ 29/846; 29/830; 29/847; 216/38; 216/105; 428/624; 428/687; 428/901

(58) Field of Classification Search .................. 29/830, 29/846, 847, 850, 852; 428/607, 901, 606, 428/612, 615, 621, 624, 625, 626, 674, 675, 428/687; 216/13, 38, 52, 105
See application file for complete search history.

(56) References Cited
U.S. PATENT DOCUMENTS 4,788,766 A * 12/1988 Burger et al. ................. 29/830
5,063,951 A    11/1991 Bard et al. ................. 134/64 R
5,096,522 A     3/1992 Kawachi et al. ............ 156/151
5,289,639 A     3/1994 Bard et al. .................... 34/380
5,378,307 A     1/1995 Bard et al. .................... 216/91
5,437,914 A *   8/1995 Saida et al. ................. 428/209

(Continued)

FOREIGN PATENT DOCUMENTS

JP          5-160208        6/1993

(Continued)

OTHER PUBLICATIONS

BondFilm (TM) The Functional Alternative for Inner Layer Bonding, www.insulectro.com/BondFilm.pdf.*

(Continued)

*Primary Examiner*—A. Dexter Tugbang
*Assistant Examiner*—Livius R Cazan
(74) *Attorney, Agent, or Firm*—Hinman, Howard & Kattell LLP; Lawrence R. Fraley; Mark Levy

(57) ABSTRACT

A circuitized substrate in which two conductive layers (e.g., electroplated copper foil) are bonded (e.g., laminated) to an interim dielectric layer. Each of the two foil surfaces which physically bond to the dielectric are smooth (e.g., preferably by chemical processing) and include a thin, organic layer thereon, while the outer surfaces of both foils are also smooth (e.g., preferably also using a chemical processing step). One of these resulting conductive layers may function as a ground or voltage plane while the other may function as a signal plane with a plurality of individual signal lines as part thereof. An electrical assembly and an information handling system utilizing such a circuitized substrate are also provided, as is a method of making the substrate.

10 Claims, 4 Drawing Sheets

U.S. PATENT DOCUMENTS

| | | | |
|---|---|---|---|
| 5,482,784 A | 1/1996 | Ohara et al. | 428/607 |
| 5,512,335 A | 4/1996 | Miller et al. | 427/600 |
| 5,545,466 A | 8/1996 | Saida et al. | 428/209 |
| 5,858,517 A | 1/1999 | Tagusari et al. | 428/29 |
| 5,897,761 A | 4/1999 | Tagusari et al. | 205/77 |
| 6,291,081 B1 | 9/2001 | Kurabe et al. | 428/606 |
| 6,322,904 B1 * | 11/2001 | Dobashi et al. | 428/624 |
| 6,475,638 B1 | 11/2002 | Mitsuhashi et al. | 428/606 |
| 6,828,514 B2 | 12/2004 | Chan et al. | 174/262 |

FOREIGN PATENT DOCUMENTS

JP  2000277913 A  * 10/2000

OTHER PUBLICATIONS

Atotech, Feb. 27, 2004, http://web.archive.org/web/20040227192435/www.insulectro.com/PCB_Chem.htm.*

* cited by examiner

METHOD OF MAKING CIRCUITIZED SUBSTRATES UTILIZING SMOOTH-SIDED CONDUCTIVE LAYERS AS PART THEREOF

TECHNICAL FIELD

The invention relates to circuitized substrates utilizing conductive sheets as part thereof, methods for making such substrates, and to electrical assemblies and information handling systems utilizing such substrates. One primary example of such a circuitized substrate is a printed circuit (or wiring) board (or card) and another is a chip carrier substrate, both of which are produced by the assignee of the present invention.

CROSS REFERENCE TO CO-PENDING APPLICATION

In Ser. No. 10/354,000, filed Jan. 30, 2003 and entitled "High Speed Circuit Board And Method For Fabrication" (inventors B. Chan et al), there is defined a multilayered circuitized substrate including two multilayered portions, one of these able to electrically connect electronic components mounted on the substrate to assure high frequency connections there-between. The substrate may further include a "conventional" substrate portion of known materials so as to reduce costs while assuring a structure having an overall thickness deemed satisfactory for use in the respective product field. Ser. No. 10/354,000 is now U.S. Pat. No. 6,828,514, having issued Dec. 7, 2004.

BACKGROUND OF THE INVENTION

As evidenced below from the descriptions of the several cited patents, there are many different approaches to manufacturing printed circuit boards and cards (hereinafter also simply referred to as PCBs), chip carriers and the like substrates. This is true with respect to substrates used in high speed and other final structures. With operational requirements increasing for complex electronic components such as semiconductor chips which mount on circuitized substrates of the types cited above, so too must the host substrate be capable of handling these increased requirements. One particular increased requirement has been the need for higher frequency (high speed) connections between two or more such mounted components, which connections, as stated, occur through the underlying host substrate. By the term "high speed" as used herein is understood to mean signals within a frequency range of from about 3.0 to about 10.0 gigabits per second (GPS) and even higher.

Such high speed connections are subjected to various detrimental effects, e.g., signal deterioration (also referred to as signal attenuation), caused by the inherent characteristics of such known substrate circuitry wiring. In the particular case of signal deterioration, this effect is expressed in terms of either the "rise time" or the "fall time" of the signal's response to a step change. The deterioration of the signal can be quantified with the formula $(Z_0 * C)/2$, where $Z_0$ is the transmission line characteristic impedance, and C is the amount of the connecting "via" capacitance (the "via" being a known plated hole within the substrate to couple different conductive layers). In a signal line (also referred to in the industry as a wire or trace) having a typical 50 ohm transmission line impedance, a plated thru-hole "via" having a capacitance of 4 pico-farads (pf) would represent a 100 pico-second (ps) rise-time (or fall time) degradation. This compares to a 12.5 ps degradation with a 0.5 pf buried "via" of the various embodiments taught in the patent application cited above. This difference is significant in systems which operate at 800 MHz or faster (becoming the "norm" in today's technical world), where there are associated signal transition rates of 200 ps or faster.

One factor that can contribute to signal attenuation is surface roughness of the conductive layer through which the signals pass. PCB manufacturers who laminate several dielectric and conductive layers to form the final board structure desire some level of roughness to promote adhesion between the two materials. Unfortunately, such roughness may also adversely affect signal passage if too excessive. As understood from the teachings herein, the instant invention is able to provide conductive layers with optimal roughness for sound adhesion to corresponding dielectric layers during bonding of such layers but also layers that are smooth enough that the surface irregularities of such layers do not significantly impede signal passage.

It is to be understood that the teachings of the present invention are not limited to the manufacture of high speed substrates such as PCBs and the like, but are also applicable to the manufacture of substrates used for other purposes than high speed signal connections. Generally speaking, the teachings herein are applicable to any such substrates in which one or more conductive layers such as copper are bonded (e.g., laminated) to an adjacent dielectric layer and the resulting composite then used as the substrate, typically when combined with other dielectric and conductive layers to form a much thicker, built-up structure. The invention is able to provide a final structure in which signal attenuation is reduced while still assuring effective conductive layer and dielectric layer adhesion.

With respect to the circuit (wiring) patterns being formed on substrates of many types of PCBs, including high speed boards as well as others, line widths may now be as small as ten-odd microns. Accordingly, the conductive layers (some also referred to as metal "foils" in the art) are becoming much thinner than those which produced wider lines in previous substrates. By way of example, when the designated thickness of metal foil for use in the formation of the conventional wiring pattern of about 100 micron line width has ranged from about 15 to 35 microns, the thickness of metal foil utilized in the formation of ten-odd micron wiring patterns must be reduced correspondingly. To accomplish this, an aluminum or copper foil may be used. Preferably, copper is used, especially an electrodeposited copper foil, produced by electrodepositing copper on a drum surface. With respect to such electrodeposited copper foil, the surface at which copper deposition is initiated (the surface at which formation of copper deposits brought into contact with the drum is initiated) is referred to as "shiny side", and the surface at which copper deposition is completed is referred to as "matte side". The surface condition of the shiny side is substantially the same as that of the drum. That is, the RMS surface roughness value (a conventional measurement of metal surface roughness for layers used in PCBs; see more below) of the drum is from about 0.1 to 0.5 microns with a maximum peak to valley roughness value from about 1.0 to 2.0 microns. (Maximum peak to valley roughness is another means of characterizing surface roughness of a metal layer such as copper foil used in PCBs) As a result, the "shiny" side of the electrodeposited copper formed on this drum (and against the drum's outer surface) has a similar roughness. On the other hand, with respect to the outer matte side of the formed copper layer, its surface roughness is greater than the surface roughness of the shiny side, typically having an RMS value of from about 1.0 to about 2.0 microns with a maximum peak to valley roughness in the range of about 3.0 to 10 microns.

There are various different methods of characterizing surface roughness in the industry including Ra (average roughness or the arithmetic average above and below the center line in a segment), Rq (or RMS, which is the square root of the average of the squared absolute distances of the surface profile from the mean line), Rt (maximum peak to valley or the height difference between the highest and lowest points in a segment) and Rz (the 10 point average surface roughness). RMS (Rq) values will be used herein and simply referred to as "RMS roughness" for ease of explanation purposes.

In the case of conventional electrodeposited copper foils, it is known to subject these foils to various treatments prior to inclusion thereof as part of a dielectric-conductive layer composite (or, more likely, a sub-composite if used in combination with other sub-composites to form a multi-layered built-up final board), including treating the foil for the purpose of increasing adhesion between the foil and dielectric layer(s) in the final structure. For example, mechanical polishing is a method of smoothing the surface of the copper foil with the use of mechanical means, usually in the form of a buffer. Unfortunately, if the foil is too thin, it may be damaged, e.g., severed or torn in sections, from the relatively high stresses exerted on the copper foil during this processing. Thus, mechanical polishing is considered suitable for preparing the surface of relatively thick copper foils only. In comparison, chemical and electrolytic polishing processes exert virtually no relatively high stresses on copper foils so it is believed that relatively thin foils may be successfully treated using one or both of these processes. However, such processes are typically expensive to operate, often requiring relatively expensive equipment, costly chemical baths, as well as prolonged periods during which the foil is so treated, thereby extending the total time of manufacture of the end product.

In U.S. Pat. No. 6,475,638 (Mitsuhashi et al), there is described a process for producing an electrodeposited copper foil with its surface prepared which includes the steps of subjecting the foil having a shiny side and a matte side to at least one mechanical polishing so that the average surface roughness (Rz) of the matte side becomes in the range of 1.5 to 3.0 microns. The matte side is then subjected to a selective chemical polishing so that the average surface roughness (Rz) of the matte side becomes in the range of 0.8 to 2.5 microns. The mechanical polishing followed by chemical polishing of the matte side enables the foil to exhibit excellent properties, according to the authors.

In U.S. Pat. No. 6,291,081 (Kurabe et al), there is described a process for producing an electrodeposited copper foil including the steps of subjecting an electrodeposited copper foil having a shiny side and a matte side to a first mechanical polishing and then subjecting the matte side having undergone the first mechanical polishing to a further mechanical polishing. A planar, highly polished face with excellent surface properties is allegedly obtained. Moreover, depressed parts are not polished, so that the amount of copper lost by the polishing steps is extremely minute.

In U.S. Pat. No. 5,897,761 (Tagusari et al), there is described an electrodeposited copper foil for use in the manufacture of printed wiring boards in which the original profile of the matte surface has been completely removed, preferably by buffing, leaving a surface having linear streaks and a certain roughness. The new surface is then given a nodule forming treatment which produces a second surface roughness, which may be followed by a corrosion resisting treatment. U.S. Pat. No. 5,858,517 (also Tagusari et al) also describes a similar process with what are considered minor modifications.

In U.S. Pat. No. 5,545,466 (Saida et al), there is described a copper-clad laminate characterized in that an electrolytic copper foil on the glossy (shiny) surface side of which a copper electrodeposit is formed, is bonded at its glossy surface side to one side or each of both sides of a substrate, which has a fine-pitch wiring (circuit) pattern and exhibits a high etching factor. This patent is a continuation-in-part of U.S. Pat. No. 5,437,914 (Saida et al), below.

In U.S. Pat. No. 5,482,784 (Ohara et al), there is described a printed circuit inner-layer copper foil having inverted tear drop-shaped fine nodules formed on both surfaces of the copper foil, the nodules each having a specific length and maximum diameter.

In U.S. Pat. No. 5,437,914 (Saida et al), there is described a copper-clad laminate characterized in that an electrolytic copper foil on the glossy surface side of which a copper electrodeposit is formed is bonded at its glossy surface side to one side or each of both sides of a substrate.

In U.S. Pat. No. 5,096,522 (Kawachi et al), there is described a process for producing a copper-clad laminate which includes the steps of contacting the surface of a conductive carrier with a catalyst liquid containing a noble metal selected from the group consisting of Pd, Pt, Ru, Au, and Ag, subsequently forming a copper foil layer on the treated surface by copper electroplating, laminating an insulating base on the copper foil layer by hot-press bonding, and then separating the conductive carrier from the resulting laminate. The copper foil layer in the resulting copper-clad laminate is claimed to have fewer pinholes and allegedly exhibits isotropic mechanical characteristics.

In four U.S. Patents cited below with respect to the definition of what is meant by a "fluid treatment device", there are described various embodiments of fluid treatment apparatus/assemblies which are specifically designed for applying precisely directly pressurized jets of fluid onto designated locations on the surface of a nearby material. As defined in these patents, such materials are typically passed through the apparatus/assembly with the fluid directed onto opposite sides thereof from the oppositely positioned sprayers, but may only be directed onto one of the sides, if desired. The various pressures attainable using these structures are defined in detail in many of these patents.

In Japanese Patent Unexamined Publication Hei 5-160208, there is disclosed a tape carrier having a lead pattern formed from an electrodeposited copper foil wherein the overall surface of the foil's matte side has been polished. This publication describes the use of an electrodeposited copper foil whose 1-2 micron matte side surface profile has been chemically polished. It is mentioned that a highly reliable carrier tape with desired lead strength can be provided by the use of the copper foil whose matte side overall surface has been so chemically polished.

According to the teachings of the present invention, there is defined a circuitized substrate in which a conductive layer (e.g., electroplated copper foil) is mated with another and bonded (e.g., laminated) to an interim dielectric layer. Each of the two foil surfaces which physically bond to the dielectric is smooth while the outer surfaces of both foils, albeit rougher than the facing sides, are also smooth. One of these resulting conductive layers may function as a ground or voltage plane while the other may function as a signal plane with a plurality of individual signal lines as part thereof. The signal lines may be extremely thin and also extremely narrow in width, in which case these are still able to enable the passage of high speed signals there-through. As stated, however, the invention is not limited to substrates with extremely thin and narrow signal lines, as it is clear from the teachings herein that substrates having thicker and wider lines than defined herein may be successfully produced.

It is believed that such a substrate and method of making same, as well as resulting electrical assemblies and information handling systems utilizing same, will represent significant advancements in the art.

OBJECTS AND SUMMARY OF THE INVENTION

It is, therefore, a primary object of the present invention to enhance the circuitized substrate art by providing a circuitized substrate having the advantageous features taught herein.

It is another object of the invention to provide a method of making such a circuitized substrate which can be accomplished in a relatively facile manner and at relatively low costs.

It is still another object of the invention to provide an electrical assembly capable of using such a circuitized substrate and thus benefiting from the several advantageous features thereof, It is yet another object of the invention to provide an information handling system capable of utilizing a circuitized substrate as part thereof to thus also benefit from the several advantageous features thereof.

According to one aspect of the invention, there is provided a method of making a circuitized substrate comprising providing at least one dielectric layer, providing first and second electrically conductive layers each having a first side of a first, relatively low roughness and a second side of a roughness greater than that of the first sides, treating these first sides of the first and second electrically conductive layers with a chemical treatment so as to minimally increase the roughness of the first sides, bonding the first sides of the first and second electrically conductive layers following the treating of these first sides to the dielectric layer such that the dielectric layer is positioned substantially between the first and second electrically conductive layers, treating the second sides of the first and second electrically conductive layers having the roughness greater than that of the first sides with a chemical treatment so as to reduce both the roughness of the second sides and the thickness of the first and second electrically conductive layers, and then forming a circuit pattern within at least one of the electrically conductive layers.

According to another aspect of the invention, there is provided a circuitized substrate comprising at least one dielectric layer having first and second opposite sides, first and second electrically conductive layers each having a first smooth side having a thin organic layer thereon bonded to the first and second opposite sides of the at least one dielectric layer, respectively, and a second etched smooth side opposite the first smooth side, and a circuit pattern formed within at least one of the electrically conductive layers having the first smooth side and second etched smooth side.

According to still another aspect of the invention, there is provided an electrical assembly comprising a circuitized substrate having at least one dielectric layer having first and second opposite sides, first and second electrically conductive layers each having a first smooth side having a thin organic layer thereon bonded to the first and second opposite sides of the at least one dielectric layer, respectively, and a second etched smooth side opposite the first smooth side, and a circuit pattern formed within at least one of the electrically conductive layers having the first smooth side and second etched smooth side, and at least one electrical component positioned on and electrically coupled to the circuitized substrate.

According to yet another aspect of the invention, there is provided an information handling system comprising a housing, a circuitized substrate positioned within the housing and including at least one dielectric layer having first and second opposite sides, first and second electrically conductive layers each having a first smooth side having a thin organic layer thereon bonded to the first and second opposite sides of the at least one dielectric layer, respectively, and a second etched smooth side opposite the first smooth side, and a circuit pattern formed within at least one of the electrically conductive layers having the first smooth side and second etched smooth side, and at least one electrical component positioned on and electrically coupled to the circuitized substrate.

BEST MODE FOR CARRYING OUT THE INVENTION

Figure 1:
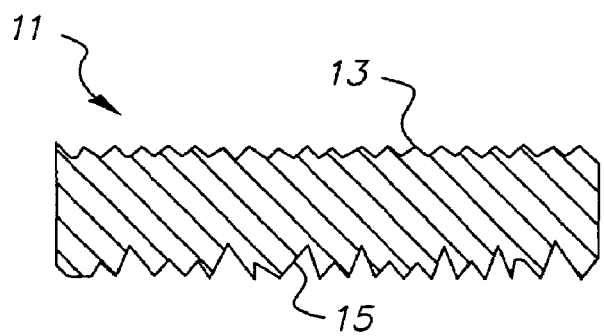
FIGS. 1-4 are much enlarged, partial side elevational views, in section, which illustrate four of the steps used to make a circuitized substrate according to one embodiment of the invention.

For a better understanding of the present invention, together with other and further objects, advantages and capabilities thereof, reference is made to the following disclosure and appended claims in connection with the above-described drawings. Like figure numbers will be used from FIG. to FIG. to identify like elements in these drawings.

By the term "circuitized substrate" as used herein is meant to include substrates having at least one dielectric layer and at least two metallurgical conductive layers. Examples include structures made of dielectric materials such as fiberglass-reinforced epoxy resins (some referred to as "FR-4" dielectric materials in the art), polytetrafluoroethylene (Teflon), polyimides, polyamides, cyanate resins, polyphenylene ether resins, photoimageable materials, and other like materials wherein the conductive layers are each a metal layer (e.g., power, signal and/or ground) comprised of suitable metallurgical materials such as copper (preferably electrodeposited copper foil as defined herein-above), but in the broader aspects may also include additional metals (e.g., nickel, aluminum, etc.) or alloys thereof. Further examples will be described in greater detail herein-below. If the dielectric materials for the structure are of a photoimageable material, it is photoimaged or photopatterned, and developed to reveal the desired circuit pattern, including the desired opening(s) as defined herein, if required. The dielectric material may be curtain-coated or screen- applied, or it may be supplied as dry film. Final cure of the photoimageable material provides a toughened base of dielectric on which the desired electrical circuitry is formed. An example of a specific photoimageable dielectric composition includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photoimageable dielectric composition. The dielectric layers taught herein may be typically about 2 mils to about 4 mils thick, but also thicker if desired. Examples of circuitized substrates include printed circuit boards (or cards), hereinafter referred to also as PCBs, and chip carriers. It is believed that the teachings of the instant invention are also applicable to what are known as "flex" circuits (which use dielectric materials such as polyimide).

By the term "electrical component" as used herein is meant components such as semiconductor chips, resistors, capacitors and the like, which are adapted for being positioned on the external conductive surfaces of such substrates as PCBs and chip carriers, and possibly electrically coupled to other components, as well as to each other, using, for example the PCB's or chip carrier's internal and/or external circuitry.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Perhaps the most well known such assembly is the conventional PCB having several external components such as resistors, capacitors, modules (including one or more chip carriers) etc. mounted thereon and coupled to the internal circuitry of the PCB.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB can be referred to as a "motherboard" while various other boards (or cards) may be mounted thereon using suitable electrical connectors.

By the term "smooth" as used herein to define the surface roughness of a side of an electrically conductive layer such as an electrodeposited copper foil is meant a layer side having an RMS surface roughness of from about 0.1 to about 0.6 microns.

By the term "fluid treatment device" as used herein is meant a pressurized fluid spray apparatus/assembly adapted for precisely directing pressurized jets of fluid onto the surface of a material, typically as the material is passed there-through in the situation where such jets impinge from opposite sides of the material or, in its simplest form, where such apparatus/assembly utilizes such jets only on one side of the material and thus fluid is impinged on only said side. Apparatus/assemblies of this type are defined in U.S. Pat. No. 5,512,335 (Miller et al), U.S. Pat. No. 5,378,307 (Bard et al), U.S. Pat. No. 5,289,639 (Bard et al) and U.S. Pat. No. 5,063,951 (Bard et al), the teachings of these patents being incorporated herein by reference. In its simplest form, such as shown in U.S. Pat. Nos. 5,063,951 and 5,289,639, the device will include a plurality of such jets oriented in rows under or over which the material being treated will pass and receive pressurized fluid, e.g., etchants, water rinse, etc. thereon. Additional structure, such as vibration means may be utilized, as defined in U.S. Pat. No. 5,512,335, as well as an overflow sump arrangement with a plurality of such devices spacedly positioned there-along. An example of this latter apparatus/assembly is defined in U.S. Pat. No. 5,378,307.

In FIG. 1, a foil 11 of electrically conductive material, preferably "standard" or "plain and stable" electrodeposited copper foil, is provided initially. In this form, foil 11 will include a first side 13 and a second, opposing side 15. By way of example, side 13, the "drum" side (meaning it was formed against the drum surface), preferably includes an RMS roughness of about 0.1 to about 0.5 microns and can thus be defined as falling within the "smooth" range stipulated above. The maximum peak-to-valley roughness (hereinafter PTV roughness) value for this side is preferably from about 1.0 micron to about 2.0 microns with an optimal value being 1.5 microns. Side 15, referred to as the "matte" side if an electrodeposited copper foil (meaning it was not against the drum), is rougher and, in this same example, preferably possesses a roughness using the same RMS standard of about 1.0 to about 3.0 microns with a maximum PTV roughness from about 2.5 to about 10.0 microns. As such, side 15 in this original configuration does not meet the definition of "smooth" as defined herein. By the term "plain and stable" when defining electrodeposited copper foil is meant a copper foil that has not received additional surface roughening treatment (e.g. a secondary nodular plating), but may have been given a known chemical anti-stain treatment. By the term "standard" when defining electrodeposited copper foil is meant a copper foil that has received an additional roughening treatment (e.g. a secondary nodular plating) to its' matte surface, and has additionally received a chemical anti-stain treatment to both surfaces. Either type of such foils is well adapted for use in the present invention, as are others known in the art. Understandably, the surface topographies depicted in the drawings are exaggerated for illustration purposes and are not meant to accurately illustrate the actual roughness of said surfaces.

As stated, a key aspect of this invention is the provision of smooth surfaced conductive layers in a final product which serve to substantially prevent signal attenuation when signals are passed there-through, but which are also "rough" enough to promote secure adhesion to corresponding dielectric layers when bonded thereto including such relatively harsh PCB production processes as lamination. This requisite laminate adhesion value is deemed to be at least three pounds per linear inch of the copper surface. To accomplish this using the new and unique teachings herein, side 13 of layer 11 is subjected to a chemical treatment in which the side is exposed to a solution containing acid, peroxide and a metal (preferably, copper). One preferred process involves processing the invention's foils through what is referred to as a "BondFilm" solution currently available on the marketplace under this name from Atotech Deutschland GmbH, an international company having a U.S.A. business address at 1750 Overview Drive, Rock Hill, S.C. The term "Bond-Film" is a trademark of Atotech Deutschland GmbH. This BondFilm solution is comprised primarily of three components: (1) sulfuric acid; (2) hydrogen peroxide; and (3) copper, as well as additional Atotech Deutschland GmbH proprietary constituents. This process is also referred to as an oxide alternative process, meaning that it does not result in the formation of oxide layers on the treated material.

Figure 2:
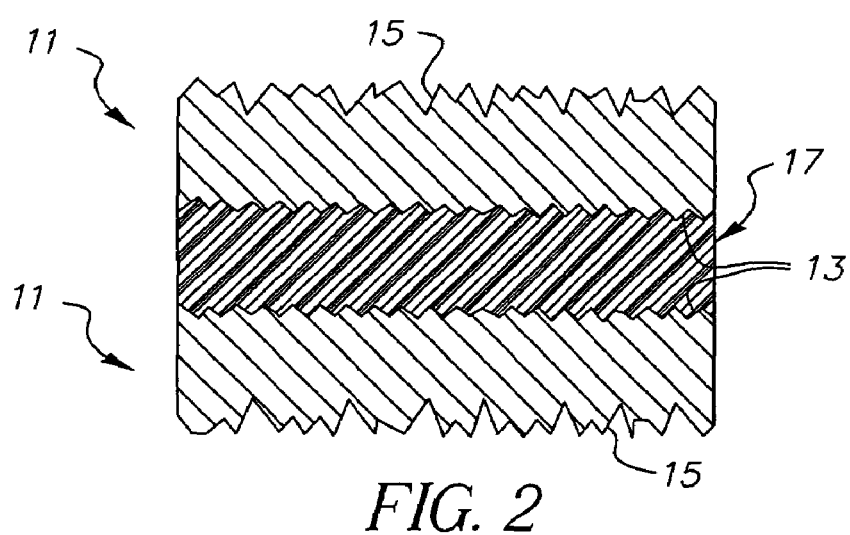

The copper conductive layers (a minimum of two, foils 11, as shown in FIG. 2) used in the invention are treated with this BondFilm solution, e.g., by immersion for a period of from about 30 to about 200 seconds at a solution temperature of about 25 to 45 degrees Celsius (C.). As part of this treatment, each conductive layer is initially cleaned and degreased, followed by an activation step, following which a micro-etch of the surfaces of sides 13 and 15 occurs. Finally, a thin organic coating is applied to both of these surfaces. Significantly, this thin organic remains on the side 13 of each layer 11 when the layer is bonded to the interim dielectric layer 17 (see more below), side 13 being bonded directly to the opposite sides of the dielectric layer. In one example, a preferred organic material is benzotriazole with a thickness only from about 50 Angstroms to about 500 Angstroms. As defined below, this film is removed from surfaces 15 during subsequent processing of foils 11. Treatment of copper foil using the above process results in an RMS roughness increase for the copper of less than 0.2 microns for surfaces 13, which is considered a minimal increase. The purpose of subjecting side 13 to this "oxide alternative" process, as understood from the foregoing, is to enhance its laminate bond strength without significantly increasing surface roughness. This finished surface is also "smooth" because the final RMS roughness is from about 0.15 to about 0.6 microns (from the original about 0.1 to about 0.5 microns) with a corresponding PTV roughness range of from about 1.2 to about 2.2 microns (and an optimal value of 1.7 microns), compared to the original peak of about 1.0 to about 2.0 microns. Significantly, this smoothness produces a finished conductive layer surface that will substantially prevent signal attenuation when signals pass near this surface, including particularly signals of the high speed variety.

In the simplest embodiment of the invention, as indicated above, two foils 11 are required, as shown in FIG. 2. Accordingly, both foils are treated with the BondFilm solution, such that both sides 13 thereof are slightly increased in roughness over the original roughness values from the drum. Therefore, the outer, rougher surfaces 15 are also rendered slightly rougher from the BondFilm solution treatment. By way of specific example, the original RMS roughness of about 1.0 microns to about 3.0 microns is increased to about only 1.05 microns to about 3.05 microns. The original peak difference of 2.5 microns to about 10 microns increases to only about 2.55 microns to about 10.05 microns. This increase is considered insignificant because of the eventual treatment of these surfaces 15, as defined in greater detail below. The organic film mentioned above is also formed on surfaces 15, but, as explained below, is removed.

In FIG. 2, two foils 11 are aligned such that the smooth sides 13 face one another and the foils are then bonded (preferably using a conventional PCB lamination process) to the interim dielectric layer 17. Preferred examples of such dielectric materials for layer 17 include fiberglass-reinforced epoxy resins, polytetrafluoroethylene (Teflon, a trademark of E. I. DuPont deNemours and Company), polyimides, polyamides, cyanate resins, polyphenylene ether resins and photoimageable materials, the most preferred of these being fiberglass-reinforced epoxy resin material known also in the PCB art as "FR-4" material (for its fire retardant rating). In the example presented above, each copper conductive layer 11 possesses an initial thickness of from about 1 mil (thousandths of an inch) to about 3 mils, while the initial thickness of layer 17 is from about 2 mils to about 15 mils. Following bonding (e.g., using conventional lamination pressures and temperatures), the resulting three-layered substrate shown in FIG. 2 will preferably possess a thickness within the range of from less than about 3 mils to about 19 mils, the reduction in thickness resulting from the compression of the interim dielectric material due to the pressures of lamination. Understandably, the copper for foils 11 maintain its original thickness.

Figure 3:
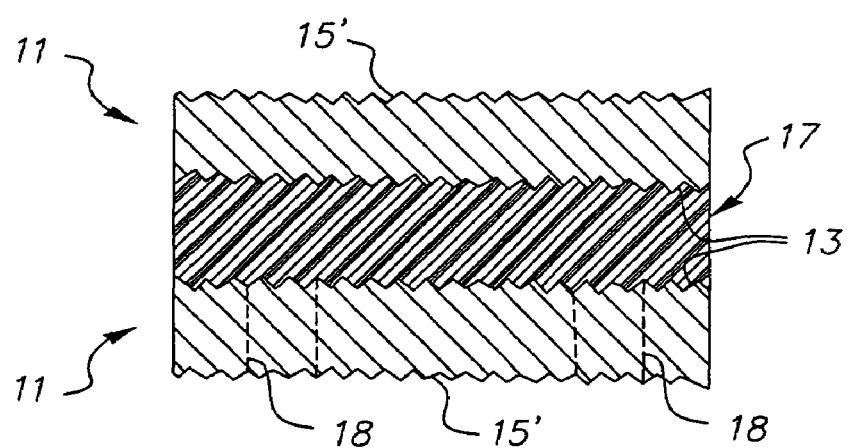

In FIG. 3, the outer and previous rougher (than surfaces 13) surfaces 15, now also slightly rougher from the BondFilm process to an RMS roughness of about 1.05 microns to about 3.05 microns, are now subjected to a fluid etch process in which etchant (a preferred example being cupric chloride) is sprayed onto the outer surfaces using a fluid treatment device of the type defined herein-above. Representative examples of such devices are defined and illustrated in one or more of the four patents cited above. During such processing, the etchant is sprayed at a pressure of from about 5 pounds per square inch (psi) to about 20 psi onto exposed surfaces 15, reducing both the roughness of these surfaces and the overall thickness of foils 11. As represented in the patents cited previously, solution flow is directed laterally across the surfaces, which acts to erode the high points on the surface at the fastest rate, thus resulting in a finished surface with significant roughness reduction. The resulting roughness is reduced significantly from the initial roughness values cited above. By way of specific examples, the RMS roughness of from about 1.05 to about 3.05 microns is reduced to only from about 0.15 to about 0.6 microns, with the original peak values reduced from 2.55 to about 10.05 microns to only about 1.2 microns to about 2.2 microns, with an optimal peak of about 1.7 microns. Significantly, these values are substantially identical to the surface roughness values of surfaces 13 against layer 17. As such, surfaces 15 (now shown as numbers 15') are also now "smooth" according to the values established above. The formed organic film is removed from this fluid treatment process, and, significantly, the overall thickness of foils 11 are reduced from the defined thickness prior to fluid treatment of about 1.0 mils to about 3.0 mils to about 0.3 mils to about 2.7 mils. The fluid treatment process is thus able to successfully reduce the roughness to the desired "smooth" values while simultaneously reducing the thickness of the copper foils without causing harm thereto as occurred with the mechanical procedures mentioned above. Equally significant, this precise reduction in thickness assures substantial prevention of signal attenuation along the now smooth surfaces 15 while providing substantial roughness adequate for effective bonding (lamination) to subsequent dielectric layers, possible in the embodiments below.

Although it is shown in FIG. 3 to provide smooth outer surfaces 15' following bonding of the smooth inner surfaces 13, this is not meant to limit the invention because it is also possible to form such smooth outer surfaces prior to the bonding. This may be accomplished by suitable retention means (not shown) for holding the foils in position while subjecting the exposed surfaces thereof to the fluid treatment process. As defined in the subject fluid treatment device patents, such retention is possible using suitable rollers or the like which direct the sheets of material to be treated through or over or under the device, depending on which device is used and how. If the foil material is to pass either over or under, the exposed foil surfaces need only pass adjacent the device sprayers. Understandably, passing the foils through one of the devices enables simultaneous treatment of both surfaces, if desired, including the situation wherein one surface is rendered more rough or smooth than the other, e.g., by adjusting the chemical formulations of the sprayed solutions and/or the spray impingement force.

It is understood that in its simplest form, the structure depicted in FIG. 3, having a minimum of two conductive layers and one insulating interim dielectric layer, may function as a circuitized substrate. Preferably, the substrate in FIG. 3 will serve as a "core" having two conductive planes (layers) and one dielectric plane (layer), which substrate may then be used solely, or, more preferably, with other similar "cores" as part of a multi-layered circuitized substrate such as shown in exploded form in FIG. 5. In one example, the final structure may include no less than ten dielectric and conductive layers and, with respect to more complex final substrate products such as PCBs for products such as information handling systems, may include as many as thirty or more total conductive and dielectric layers.

In one embodiment of the invention, the lower conductive layer may serve as a power or ground plane for the substrate and is thus spaced from the upper signal plane by the thickness of dielectric 17. If such a plane, it is desirable to provide a plurality of clearance openings 18 (shown hidden in FIG. 3) within the layer for allowing formation of thru-holes in a larger product in which such holes are desired. If such openings 18 are provided, this is preferably done by etching or mechanical drilling and occurs preferably after bonding of foils 11 to interim dielectric layer 17.

Figure 4:
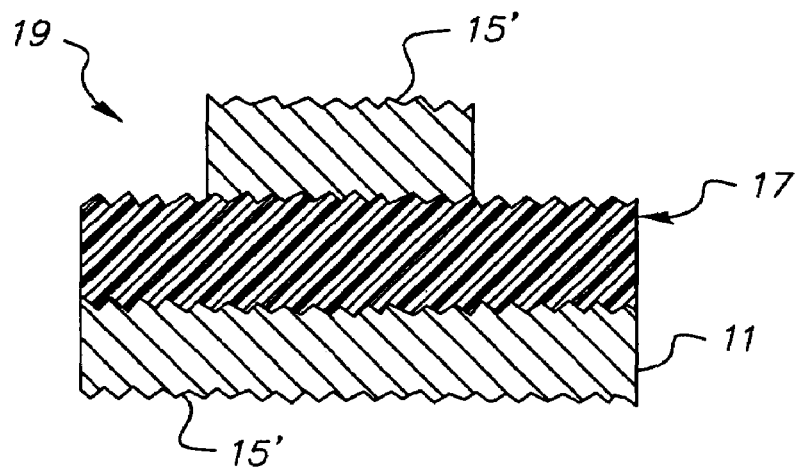

In FIG. 4, the upper conductive layer 11 has been further treated to form a plurality of signal conductors 19 (only one shown in FIG. 4 for simplification purposes). This is preferably achieved using conventional photolithographic processing known in the art in which a photo-resist (not shown) is applied over the upper conductive layer, patterned and exposed (through the pattern), and the photo-resist then "developed" to enable removal of selected portions of the underlying metal in this layer and the formation of several conductors 19. In a preferred example, conductors 19 are in the form of very thin signal lines having a width of only about three mils and a thickness of about 0.5 mils. The lines are in turn spaced apart only six mils from center-to-center to give an excellent idea of the highly dense circuit pattern attainable using the teachings herein. If the upper conductive layer is not used solely as a signal layer, the conductors may also be in the form of pads, such as those adaptable for having a solder connection formed thereon should the pad be on the upper surface of the resulting substrate. Alternative structures for conductors 19 are also possible.

Figure 5:
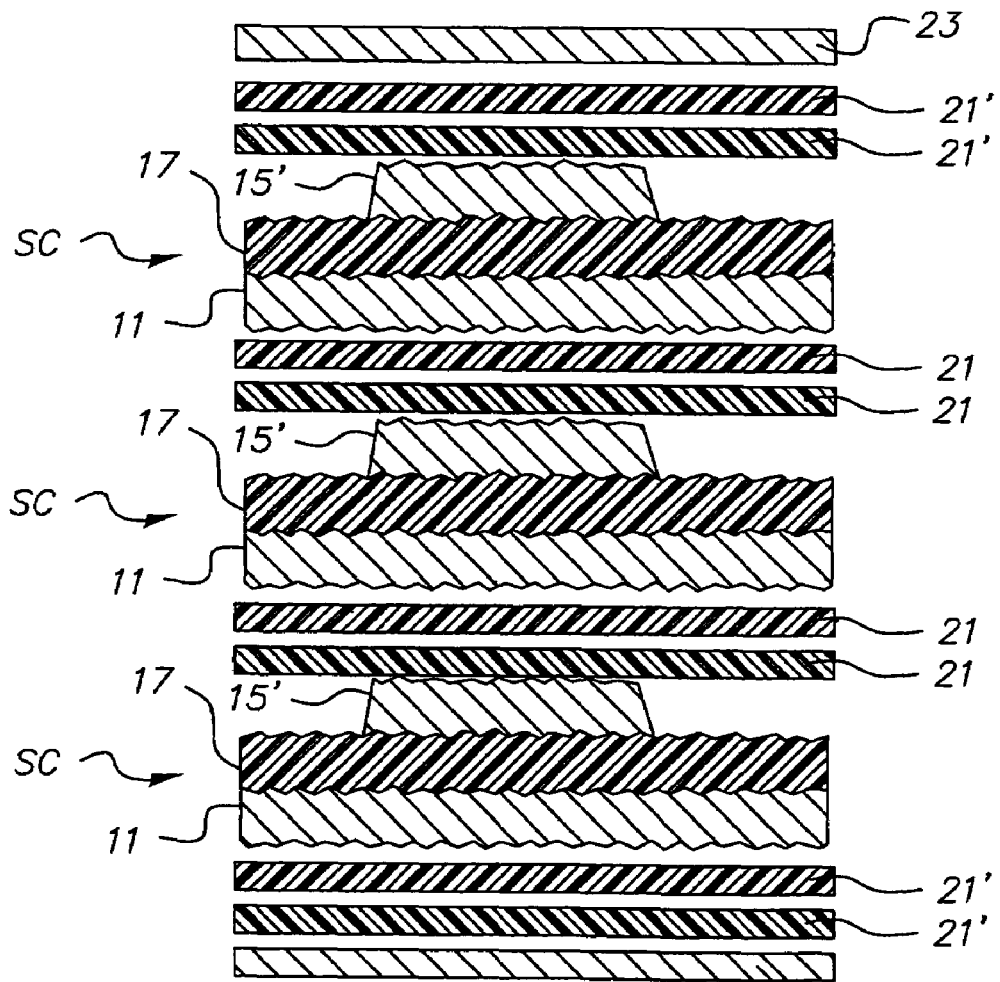
FIG. 5 is an exploded side elevational view illustrating a multi-layered circuitized substrate in which several additional layers over those shown and defined for the circuitized substrate in FIGS. 1-4 are used; including using three of the substrates formed in FIGS. 1-4 as subcomponents (or subcomposites) of this multi-layered structure.

In FIG. 5, three of the circuitized substrates (each referred to as SC in FIG. 4) shown in FIG. 4 are now aligned with two dielectric layers 21 between adjacent pairs of the substrates and two added pairs of dielectric layers 21' positioned externally of the outermost two substrates. Each of these layers 21 and 21' is preferably a B-staged fiberglass-reinforced epoxy resin material known also in the PCB art as "FR-4" material and has an initial thickness of only about 1 mil to 5 mils. As mentioned above, such layers are known in the art and further description is thus not considered necessary. In addition to these, at least one conductive layer 23 (preferably copper, having a thickness of about 0.5 mils) is positioned outside each of the outermost pair of dielectric layers 21'. These outer conductive layers function as the outer conductors for the finished multi-layered circuitized substrate shown in FIG. 5, following lamination of the several layers and substrates, preferably using conventional PCB lamination processing.

Figure 6:
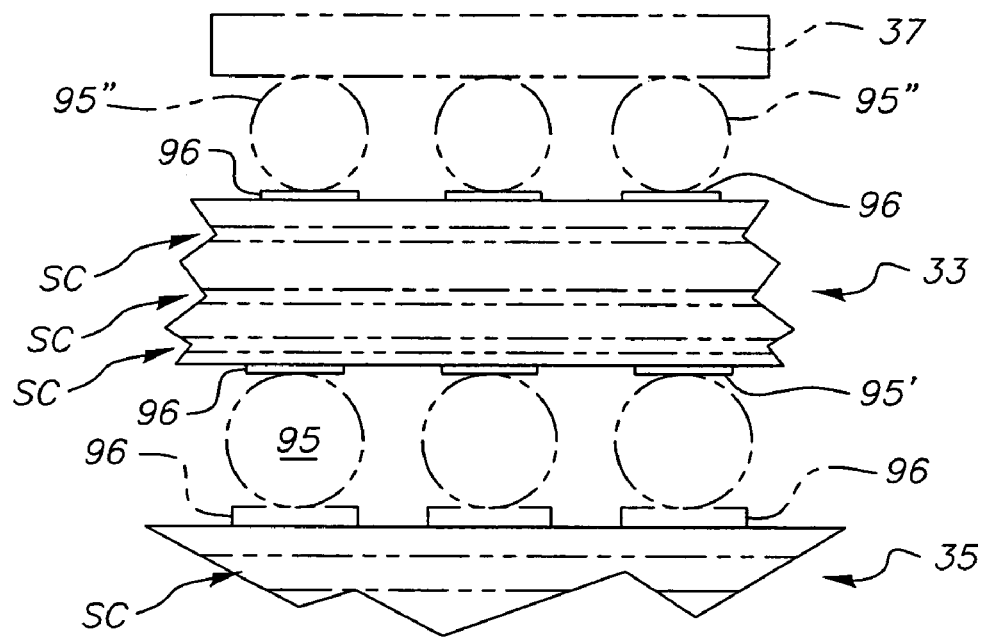
FIG. 6 is a partial, side elevational view, showing the multi-layered substrate of FIG. 5 functioning as a chip carrier in one aspect, and as a PCB in another aspect, thus illustrating two different types of electrical assemblies adapted for using one or more of the circuitized substrates of the present invention.

FIG. 6 illustrates two electrical assemblies 33 and 35 attainable using the teachings herein. Assembly 33 is understood to be a chip carrier or similar structure on which is positioned at least one semiconductor chip 37 preferably using a plurality of solder balls 95", while assembly 35 is understood to be a typically larger PCB or similar structure on which such a carrier is usually positioned and electrically coupled thereto, again preferably using solder balls 95' of the same or different solder composition as that used for solder balls 95". Significantly, each assembly 33 and 35 preferably includes at least one and perhaps several substrates of the type formed herein. Coupling of the chip, carrier and PCB using solder balls as shown understandably utilizes various conductive (e.g., copper) pads 96 which are coupled in the paired orientation as shown. Such solder ball and pad connections are known in the art. It is worth repeating that pads 96 can be formed as part of the end (upper surface) substrate.

Figure 7:
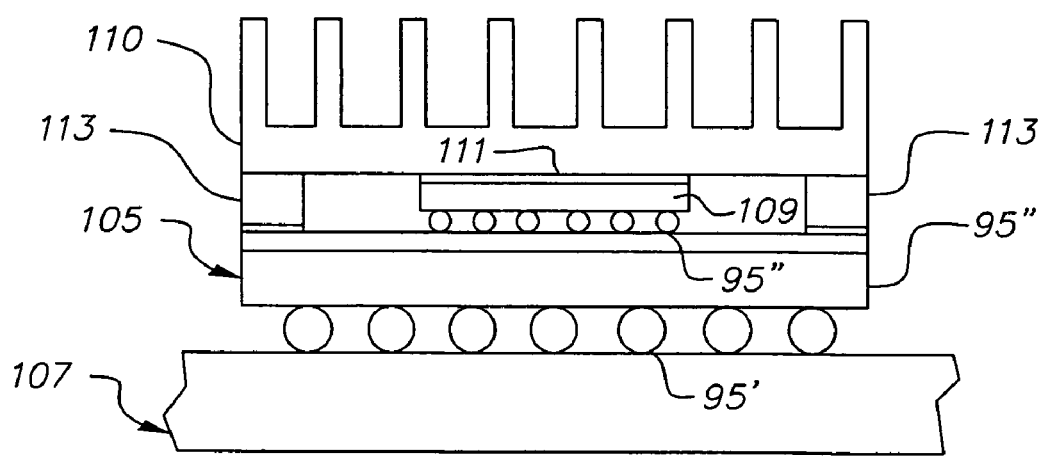
FIG. 7 is a side elevational view showing two electrical assemblies of the type above, in greater detail.

FIG. 7 represents examples of the structures defined herein-above, the structure referenced by the numeral 105 being a chip carrier similar to assembly 33 in FIG. 6, while the structure represented by the numeral 107 is a PCB and thus similar to assembly 35 in FIG. 6. As stated, both such PCB and chip carrier assemblies are produced and sold by the assignee of the invention. In the embodiment (assembly) of FIG. 7, the chip carrier 105 is mounted on and electrically coupled to PCB 107 using a plurality of the aforementioned solder balls 95', the chip carrier 105 in turn having the semiconductor chip 109 (similar to chip 37) positioned thereon and electrically coupled to the carrier using the second plurality of solder balls 95". The assembly in FIG. 7, in greater detail than the structure of FIG. 6 in some respects, may also include a heat sink 110 thermally coupled to the chip 109, e.g., using a conductive paste 111, and positioned on the upper surface of carrier 105 by appropriate standoffs 113, as is known in the art. It is also within the scope of those skilled in the art to utilize an encapsulant material (not shown) to substantially encase the chip and also to eliminate the heat sink if such an encapsulant material is used. Encapsulant material is also possible about the lower pluralities of solder balls 95'. It is even further within the scope of the invention to couple chip 109 using conventional wire-bonding in which a plurality of fine wires (not shown) are bonded between chip conductor sites and corresponding conductor pads on the underlying substrate.

Figure 8:
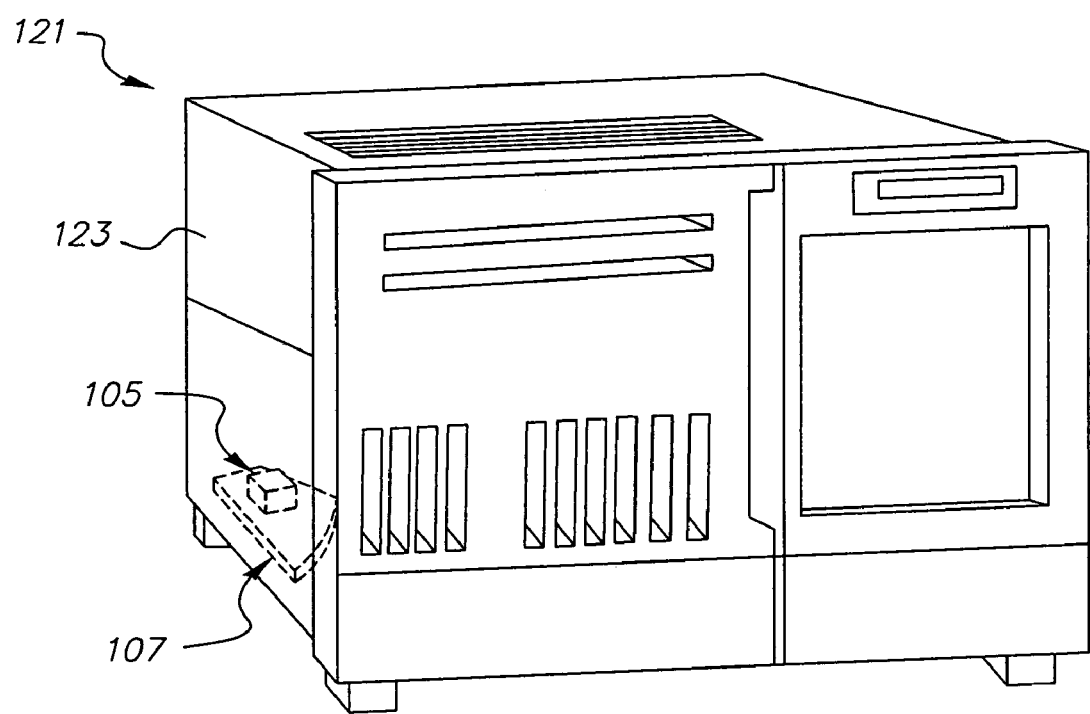
FIG. 8 is a perspective view, on a much reduced scale, showing an information handling system adapted for using one or more of the electrical assemblies and circuitized substrates taught herein.

In FIG. 8, there is shown an information handling system 121 which is preferably a personal computer, a mainframe computer or a computer server. Other types of information handling systems known in the art of this type may also utilize the teachings of this invention. The circuitized substrate or substrates as formed in accordance with the teachings herein may be utilized in the system 121 as a PCB 107 (shown hidden) and/or a chip carrier 105 (also shown hidden). The circuitized substrates may be utilized as a mother board in system 121 or as one or more individual PCBs typically utilized in such systems. As is known, systems 121 are usually contained within a suitable metal or insulative housing such as shown by the numeral 123, with appropriate venting (if desired) therein, as well as instrumentation externally accessible for system operation by the system's designated operator. The remaining elements of information handling systems of these types are known in the art and further description is not believed necessary.

Thus there has been shown and described a circuitized substrate which utilizes at least one dielectric layer with at least one conductive plane on opposite sides thereof which is formed in a new and unique manner so as to enhance the passage of high speed and other signals there-through. The conductive foils rendered substantially "smooth" on each surface in accordance with the teachings herein exhibited significantly lower signal (attenuation) losses at the 1.5 GHz (gigahertz) range. Additionally, as frequencies increased (e.g., from about 1 to about 10 GHz), the rate of loss (in decibels per inch) dropped significantly in comparison to the copper layers of greater roughness. In one example of the invention, two separate substrates were prepared. One was prepared having 1.4 mil thick circuit lines with corresponding widths of 5 mils each. The copper surface RMS roughness was 0.3 microns on one side and 1.5 microns on the other side for this one substrate. Polyclad LD-621 (a glass cloth reinforced polyphenylene ether resin dielectric material available from Cookson Electronics having an office at 144 Harvey Road, Londonderry, N.H.) was used as the dielectric material. Measured signal attenuation for a 20 centimeter signal line length at a frequency of about 1.5 GHz was 1.5 dBs (decibels). In sharp comparison, the second substrate prepared of the same dielectric and copper materials and thicknesses according to the teachings of this invention used copper foils with an RMS surface roughness of 0.3 microns on both sides of the foil. The measured signal attenuation for the signal lines of this second substrate was significantly lower, at about only 1.2 dBs.

The various structures which may utilize one or more circuitized substrates taught herein thus also inherit the several advantageous features of this structure. The circuitized substrate as defined may be produced using known PCB and/or chip carrier or the like manufacturing processes and are thus producible at relatively low cost, enabling the passage of such low costs on to assemblies utilizing these substrates.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a circuitized substrate comprising:
    providing at least one dielectric layer;
    providing first and second electrically conductive layers each having a first side of a first, relatively low roughness and a second side of a second roughness greater than said first, relatively low roughness of said first sides;
    treating said first and second sides of said first and second electrically conductive layers with a first chemical treatment so as to etch said first and second sides and thereby minimally increase said first relatively low roughness of said first sides to a first greater roughness and also minimally increase said second roughness of said second sides to a second greater roughness greater than said first greater roughness, said first chemical treatment including depositing a thin organic layer on said first and second sides of said first and second electrically conductive layers;
    bonding said first sides of said first and second electrically conductive layers having said thin organic layer thereon following said treating of said first and second sides to said dielectric layer such that said dielectric layer is positioned substantially between said first and second electrically conductive layers;
    treating said second sides of said first and second electrically conductive layers after said bonding of said first sides of said first and second electrically conductive layers to said dielectric layer with a second chemical treatment different from said first chemical treatment so as to etch said second sides but not to include a thin organic layer thereon, said second chemical treatment reducing both said second greater roughness of said second sides and the thickness of said first and second electrically conductive layers such that said second greater roughness of said second sides is substantially similar to said first greater roughness of said first sides during said bonding of said first sides to said dielectric layer; and
    forming a circuit pattern within at least one of said electrically conductive layers.

2. The method of claim 1 wherein said providing said first and second electrically conductive layers comprises providing said first and second electrically conductive layers in which said first, relatively low roughness includes an RMS surface roughness within the range of from about 0.1 micron to about 0.5 micron prior to said treating of said first and second sides.

3. The method of claim 2 wherein said providing of said first and second electrically conductive layers comprises providing said first and second conductive layers in which said second roughness of said second sides includes an RMS roughness within the range of from about 1.0 micron to about 3.0 microns.

4. The method of claim 1 wherein said treating of said first and second sides with said first chemical treatment comprises subjecting said first sides to a solution including acid.

5. The method of claim 1 wherein said bonding of said first sides of said first and second electrically conductive layers to said dielectric layer is accomplished using a lamination process.

6. The method of claim 1 wherein said treating of said second sides of said first and second electrically conductive layers is accomplished using a fluid treatment device.

7. The method of claim 1 further including providing a plurality of openings within said second electrically conductive layers following said bonding of said second electrically conductive layers to said dielectric layer.

8. The method of claim 1 wherein said forming of said circuit pattern within said at least one of said electrically conductive layers is accomplished using a chemical treatment including exposing said at least one of said electrically conductive layers to an etchant.

9. The method of claim 8 wherein the total number of dielectric layers and electrically conductive layers within said circuitized substrate is greater than ten.

10. The method of claim 1 further including adding additional dielectric and electrically conductive layers on opposite sides of said circuitized substrate having said at least one dielectric layer and said first and second electrically conductive layers, and forming a circuit pattern within selected ones of said additional electrically conductive layers.

* * * * *